United States Patent [19]
Hidaka et al.

[11] Patent Number: 5,179,687
[45] Date of Patent: Jan. 12, 1993

[54] SEMICONDUCTOR MEMORY DEVICE CONTAINING A CACHE AND AN OPERATION METHOD THEREOF

[75] Inventors: Hideto Hidaka; Kazuyasu Fujishima; Yoshio Matsuda; Mikio Asakura, all of Hyogo, Japan

[73] Assignee: Mitsubishi Denki Kabushiki Kaisha, Tokyo, Japan

[21] Appl. No.: 542,682

[22] Filed: Jun. 25, 1990

Related U.S. Application Data

[63] Continuation of Ser. No. 248,712, Sep. 26, 1988, abandoned.

[30] Foreign Application Priority Data

Sep. 26, 1987 [JP] Japan .................. 62-241057

[51] Int. Cl.$^5$ .................. G06F 12/08; G06F 13/00; G11C 7/00
[52] U.S. Cl. .................. 395/425; 364/DIG. 1; 364/243.41; 365/49; 365/193
[58] Field of Search .................. 365/49, 230.03, 189.12, 365/193; 395/425

[56] References Cited

U.S. PATENT DOCUMENTS

| | | |
|---|---|---|
| 4,330,852 | 5/1982 | Redwine et al. |
| 4,577,293 | 3/1986 | Matick et al. .................. 365/189 |
| 4,685,082 | 8/1987 | Cheung et al. .................. 365/49 |
| 4,725,945 | 2/1988 | Kronstadt et al. .................. 364/200 |
| 4,731,758 | 3/1988 | Lam et al. .................. 365/189.05 |
| 4,797,814 | 1/1989 | Brenza .................. 364/200 |
| 4,803,621 | 2/1989 | Kelly .................. 364/200 |
| 4,847,758 | 7/1989 | Olson et al. .................. 364/200 |
| 4,926,385 | 5/1990 | Fujishima .................. 365/230.03 |

OTHER PUBLICATIONS

"CHMOS DRAMs-A New Memory Alternative for Digital Signal Processing Applications", Application Note on 256K CMOS DRAM of Intel Corp., pp. 1-276 to 1-279.

"A High Speed Dual Port Memory with Simultaneous Serial and Radnom Mode Access for Video Application", R. Pinkham et al., IEEE Journal of Solid-State Circuits, vol. A sc-19, No. 6, Dec. 1984, pp. 999-1007.

"The Use of Static Column RAM as a Memory Hierarchy" by J. G. Goodman et al., IEEE 11th Annual Symposium on Computer Architecture, 1984, pp. 167-174.

Asakura et al., "An Experimental 1Mb Cache Dram with ECC", *1989 Symposium on VLSI Circuits*, (May 25-27, 1989), pp. 43-44.

Asakura et al., "An Experimental 1-Mbit Cache DRAM with ECC", *IEEE Journal of Solid-State Circuits*, vol. 25, No. 1 (Feb. 1990), pp. 5-10.

Hidaka et al., "The Cache DRAM Architecture: A DRAM with an On-Chip Cache Memory", *IEEE Micro* (Apr. 1990), pp. 15-24.

*Primary Examiner*—Alyssa H. Bowler
*Attorney, Agent, or Firm*—Lowe, Price, Le Blanc & Becker

[57] ABSTRACT

A DRAM for use in a simple cache memory system comprises a memory cell array divided into a plurality of blocks, a plurality of data registers provided corresponding to the respective blocks of the array for latching memory cell data of the corresponding blocks, and a selector responsive to a row address strobe signal for selecting access to either the data registers or the memory cell array. Upon cache hit, the row address strobe signal is inactivated to cause the selector to select the access to the data registers. Upon cache miss, the row address strobe signal is activated to cause the selector to select the access to the memory cell array.

16 Claims, 9 Drawing Sheets

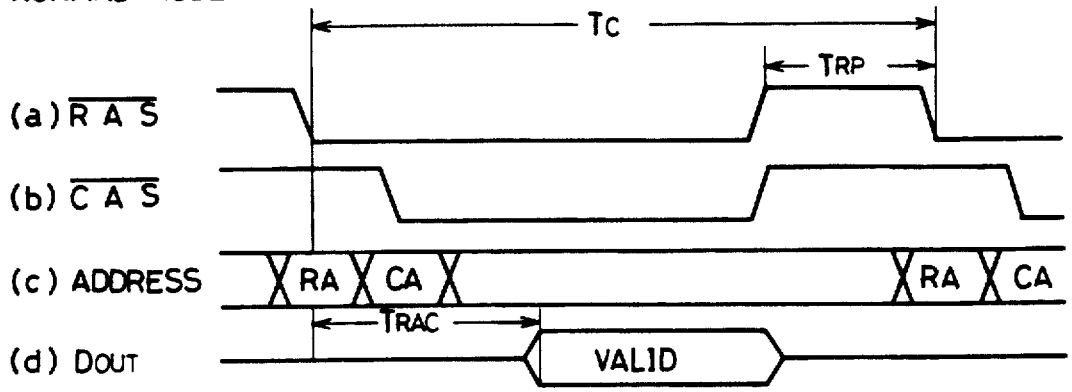
FIG.2 PRIOR ART — NORMAL MODE
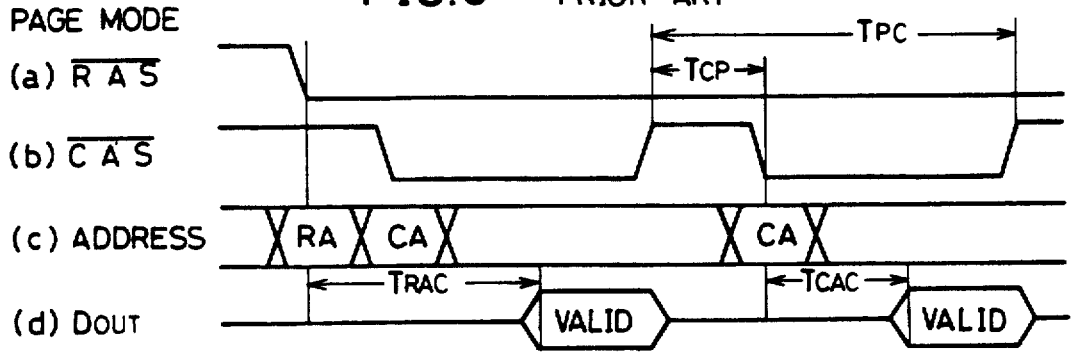
FIG.3 PRIOR ART — PAGE MODE
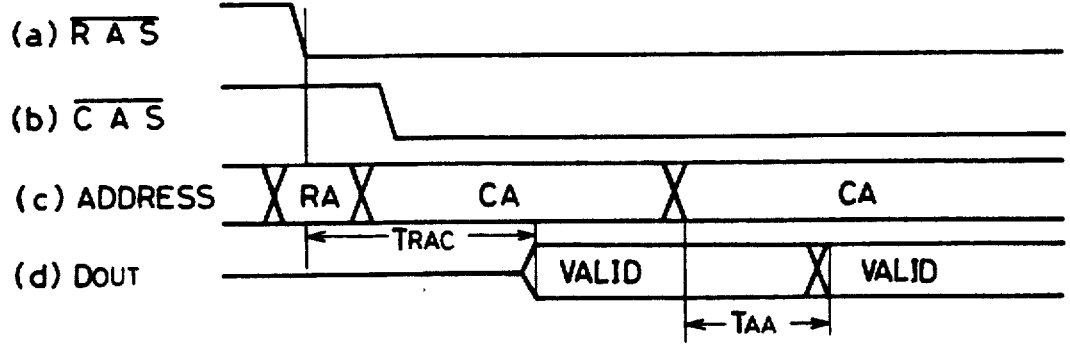
FIG.4 PRIOR ART — STATIC COLUMN MODE

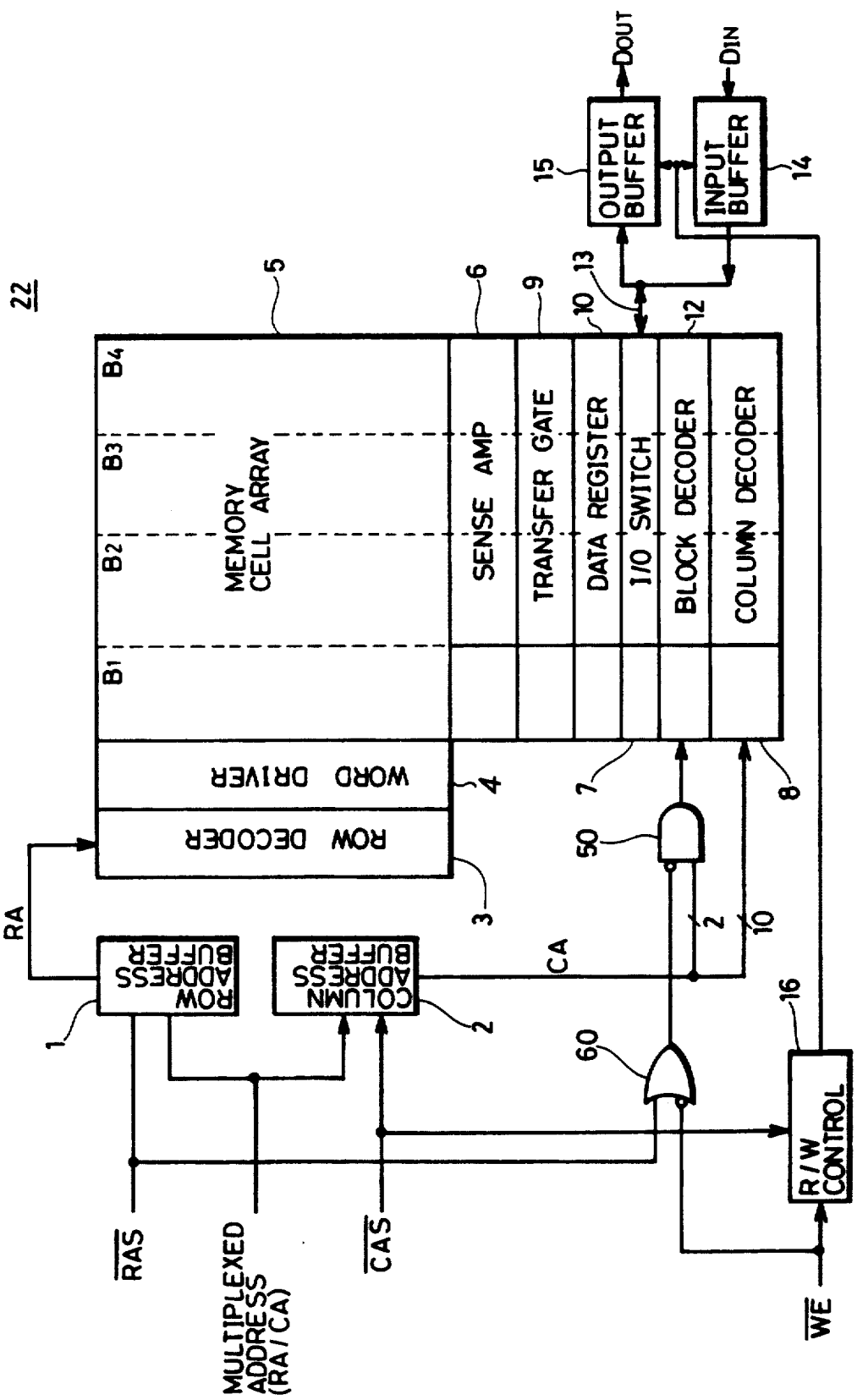

SEMICONDUCTOR MEMORY DEVICE CONTAINING A CACHE AND AN OPERATION METHOD THEREOF

This application is a continuation application of application Ser. No. 07/248,712, filed Sept. 26, 1988, now abandoned.

BACKGROUND OF THE INVENTION

1. Field of the Invention

The present invention generally relates to semiconductor memory devices and particularly to a construction and an operation method of a semiconductor memory device containing a cache memory of a simple structure in which a cache hit rate is improved without increasing the number of pin terminals.

2. Description of the Prior Art

A computer system generally comprises a central processing unit (CPU) for execution of instructions received and the like, and a main memory for storage of data, programs and the like necessary for the CPU. It is desirable to operate the CPU at high speed with no wait from the viewpoint of improvement of the performance of the system. For this purpose, it is necessary to reduce time of access to the main memory to a value as short as possible so that it can correspond to an operation speed of the CPU. These days, a clock cycle of the CPU tends to be made as fast a cycle as 16 MHz or 20 MHz, which unavoidably requires reduction of the access time with respect to the main memory. However, this requirement comes to surpass the limits of the performance of a DRAM (Dynamic Random Access Memory) used in the main memory. To cope with this, a high-speed memory is required; however, it is expensive and not desirable from a viewpoint of cost performance. One of the methods for solving this difficulty is a cache memory system in which memories are arranged in a hierarchy manner. In this system, a DRAM (,or DRAMs) which has a large storage capacity with a low operating speed and therefore is inexpensive is used as a main memory, and a small-capacity but high-speed buffer memory is provided between the CPU and the low-speed main memory. Frequently used data in the main memory is stored in the high-speed buffer memory in accordance with a request from the CPU. In response to accessing from the CPU, the requested data is read from and written into the high-speed buffer memory in place of the main memory. This high-speed buffer memory is called a cache memory. A state in which data of an address to be accessed by the CPU exists in the cache memory is called "hit", and in this case, the CPU accesses the high-speed cache memory. On the other hand, a state in which data of an address to be accessed by the CPU does not exist is called miss. In this case, the CPU accesses the low-speed main memory and also transfers a block to which the requested data belongs from the main memory to the cache memory. The cache memory stores the transferred block of data to be ready for the subsequent accessing from the CPU.

As described above, the cache memory does not store data in a fixed manner. An area of the main memory, which is stored in the cache memory changes dependent on a request from the CPU. However, the area of the main memory accessed from the CPU has locality in a data processing. Accordingly, data fetched from the main memory to be stored in the cache memory is likely to be accessed for a while thereafter. Consequently, once data of the main memory is stored in the cache memory, the function of the high-speed memory is fulfilled most effectively and there is no wait in memory accessing by the CPU. In other words, processing operation of the CPU is never delayed due to a memory access time.

Thus, the high-speed cache memory is provide as a buffer between the low-speed and large-capacity main memory and the high-speed CPU and accordingly it is made possible to improve the system performance and the cost performance. However, the above described cache memory system requires a high-speed memory which is of small capacity but is expensive. For this reason, the cache memory system cannot be applied to a small-sized system, which is desired to have a low cost.

Therefore, in a conventional small-sized system, a simplified cache system is formed by utilizing a page mode and a static column mode which are high-speed access modes of a general-purpose DRAM.

Referring first to FIG. 1, a construction of a DRAM having a high-speed access mode will be described. The DRAM comprises a memory cell array 5 where memory cells for storing information are arranged in a matrix of rows and columns. The rows of the memory cell array 5 are defined by word lines WL while the columns of the array 5 are defined by bit lines BL. FIG. 1 typically shows one word line WL, one bit line BL and a memory cell MC located at an intersection of those lines. A sense amplifier 6 is provided corresponding to columns of the memory cell array 5, to detect, amplify and latch a signal potential appearing on a bit line concerned when a word line is selected.

A row address buffer 1, a row decoder 3 and a word driver 4 are provided to select memory cells of one row of the memory cell array 5. The row address buffer 1 accepts an externally applied row address in response to a control signal $\overline{RAS}$ and generates an internal row address RA. The row decoder 3 decodes the internal row address RA from the row address buffer 1 and designates one word line. The word driver 4 responds to a row address decode signal from the row decoder 3 and activates the word line designated by the decode signal.

A column address buffer 2, a column decoder 8 and an input/output (I/O) switch 7 are provided to select memory cells of one column out of the memory cell array 5. The column address buffer 2 accepts an externally applied column address in response to a control signal $\overline{CAS}$ to generate an internal column address CA. The column decoder 8 decodes the internal column address CA from the column address buffer 2 and generates a signal for selecting a column designated by the column address. The I/O switch 7 responds to a column address decode signal from the column decoder 7 to connect the column (a bit line) designated by the decode signal to an I/O bus 13.

To input and output data, there are provided an input buffer 14 for generating internal data upon receipt of external input data $D_{IN}$ and supplying the internal data to the I/O bus 13, and an output buffer 15 for generating external data $D_{OUT}$ upon receipt of memory cell information selected by row and column addresses through the I/O bus 13.

In order to control data input/output operation of the memory, there is provided a read/write (R/W) control 16 for controlling a data input/output buffer 14 and a data output buffer 15 in response to a write enable signal $\overline{WE}$ and the signal $\overline{CAS}$.

A row address and a column address as external addresses are multiplexed and supplied through the same pins to the DRAM. The control signal $\overline{RAS}$ provides operation timing to circuits related with the row address. When the signal $\overline{RAS}$ is activated, a memory cycle is started. The signal $\overline{CAS}$ provides operation timing to circuits related with selection of a column. This signal also provides timing for writing of data dependent on an operation mode selected. Referring now to FIGS. 2 to 4 which are waveform diagrams showing operation of the DRAM, the operation of the DRAM will be described.

Referring first to FIG. 2, a normal operation cycle of the DRAM will be described. When the signal $\overline{RAS}$ falls to "L" (low) level, a memory cycle is started. At a falling edge of the signal $\overline{RAS}$, an externally applied row address is accepted in the DRAM chip and an internal row address RA is generated from the row address buffer 1 and is supplied to the row decoder 3. The row address is decoded in the row decoder 3, whereby one word line is selected to be activated through the word driver 4. As a result, information stored in one row of memory cells connected to the selected word line is transmitted onto the respective bit lines (columns). The information on the respective bit lines is detected, amplified and latched by the sense amplifiers 6. On the other hand, when the signal $\overline{CAS}$ falls, an externally applied column address is accepted by the column address buffer 2 and an internal column address CA is generated. The column decoder 8 decodes the internal column address CA and selects a column designated by the column address. The I/O switch 7 connects the column (the bit line) selected by the column decode signal from the column decoder 7 to the I/O bus 13. As a result, information stored in the selected memory cell and amplified and latched by the sense amplifier 6 is outputted through the output buffer 15 as an external data $D_{OUT}$.

Thus, in the normal operation cycle, a row address is accepted in the chip at a falling edge of the signal $\overline{RAS}$ and then a column address is accepted in the chip at a falling edge of the signal $\overline{CAS}$. After that, data of the memory cell selected by the row address RA and the column address CA is outputted. Accordingly, $\overline{RAS}$ access time $T_{RAC}$ shown in FIG. 2 is required as the access time (namely, a period from the fall of the signal $\overline{RAS}$ to the output of valid data). A cycle time Tc is a sum of a period in which the DRAM is active (namely, a period of "L" level of the signal $\overline{RAS}$) and a $\overline{RAS}$ precharge period (namely, a period of "H" (high) level of the signal $\overline{RAS}$, in which the device is in a state). An average value of the cycle time Tc is about 200 ns in the DRAM with $T_{RAC}=100$ ns.

Referring now to FIG. 3, page mode operation will be described. First, a row address and a column address are provided in the same manner as in the normal operation cycle, whereby information of a selected memory cell is read out through the output buffer 15. Then, the signal $\overline{CAS}$ is raised to "H" level with the signal $\overline{RAS}$ being maintained at "L" level. As a result, circuits related with column selection, such as the column address buffer 2 and the column decoder 8, are reset. On the other hand, the sense amplifiers 6 is latching information of memory cells of one row selected by the row address RA because the signal $\overline{RAS}$ is at "L" level. Then, when a column address is provided and a signal $\overline{CAS}$ falls to "L" level, a column (a bit line) corresponding to the newly supplied column address is selected and information on the column selected by the column decoder 8 and the I/O switch 7 is read out through the I/O bus 13 and the output buffer 15. Operation of accepting a new column address for each toggle of the signal $\overline{CAS}$ is permitted to be repeated by any number of times within a period in which the signal $\overline{RAS}$ is allowed to be maintained at "L" level. In short, the page mode operation is operation for accessing memory cells connected in the same row by changing only the column address. Since only the column address is changed, it is not necessary to accept a row address for each accessing and thus accessing operation can be performed at a higher speed than that in the normal operation cycle.

Referring to FIG. 4, a static column mode will be described. In the static column mode, the first accessing is performed in the same manner as in the normal operation cycle. Thus, a row address and a column address are accepted in the chip in response to the signals $\overline{RAS}$ and $\overline{CAS}$, respectively, and information of a memory cell selected is read out. Then, valid data is read out and after an elapse of a predetermined period, the column address is changed with the signals $\overline{RAS}$ and $\overline{CAS}$ being maintained at "L" level. As a result, information of a memory cell corresponding to a new column address out of the memory cells of the same row is read out. Although in this operation mode, the signal $\overline{RAS}$ is maintained at "L" level and information of the memory cells of one row designated by the initially supplied row address is latched by the sense amplifiers. Thus, the static column mode is also a mode in which the memory cells connected in the same row are accessed by changing only the column address, as in the page mode. However, in the same manner as in the case of a static RAM, the signal $\overline{CAS}$ is maintained at "L" level (corresponding to a signal $\overline{CS}$ in a static RAM) and access is made only by changing a column address. Accordingly, it is not necessary to toggle the signal $\overline{CAS}$ and thus access can be made generally at a higher speed than that in the page mode.

An access time $T_{CAC}$ in the page mode (namely, a period from a fall of the signal $\overline{CAS}$ to an output of a valid data) and an access time $T_{AA}$ in the static column mode (namely, a period from a change of the column address to an output of valid data, that is, an address access time), both are about a half of the $\overline{RAS}$ access time $T_{RAC}$ in the normal operation mode. For example, if $T_{RAC}=100$ ns, both $T_{CAC}$ and $T_{AA}$ are about 50 ns. In addition, the cycle time is also shortened and in the case of the page mode, the cycle time is about 50 ns as in the static column mode although it depends on a value of the $\overline{CAS}$ precharge time Tcp.

Now, high-speed accessing operation of the DRAM will be briefly described with reference to FIG. 1.

As shown in FIG. 1, a multiplexed row and column addresses are supplied to the row address buffer 1 and the column address buffer 2, respectively. When the signal $\overline{RAS}$ falls to "L" level, an internal row address RA is supplied from the row address buffer 1 to the row decoder 3 in response to the falling edge thereof, so that the internal address RA is decoded. The word driver 4 is driven by the decoded row address from the row decoder 3, thereby activating one word line in the memory cell array 5 selected by the internal row address RA. As a result, data of the respective memory cells connected to the selected (activated) word line appear on the related bit lines to be transmitted to the sense amplifiers 6. The sense amplifiers 6 detect, amplify and latch the data supplied thereto. Thus, at this time, data on one row corresponding to the designated row address are latched by the sense amplifiers 6. Thereafter, if data in a memory cell on the same row is accessed by the row address, the above described page mode and static column mode can be utilized.

More specifically, in the page mode, the column address buffer 2 transmits the column address supplied thereto to the column decoder 8 in response to a falling edge of the signal $\overline{CAS}$. As a result, one of the data latched by the sense amplifier 6 (in the case of × 1-bit structure) is selected by the decoded address and provided as output data $D_{OUT}$ through the output buffer 8.

In the static column mode, a trigger of column (bit line) selection is given by a change in the multiplexed address MXA, namely, a transition in the column address supplied to the column address buffer 2. Other operation is the same as in the page mode.

A description of static column mode operation and a description of a cache system using DRAMs operable in the static column mode are given in "The Use of Static Column RAM as a Memory Hierarchy" by J. G. Goodman et al, IEEE 11th Annual Symposium on Computer Architecture, 1984 pp. 167-174.

Page mode operation and ripple mode/static column mode operation as well as a cache system using DRAMs operable in those modes are described in an Application Note on 256K CMOS DRAM of Intel Corp., pp. 1-276 to 1-279.

Referring to FIG. 5, description is now made of construction and operation of a simple cache memory system using a fast access mode such as the above described page mode or static column mode.

A main memory system shown in FIG. 5 comprises eight DRAMs 22-1 to 22-8 each capable of performing fast serial access operation. Each of the DRAMs 22-1 to 22-8 has a 1M × 1b structure. More specifically, each of the DRAMs 22-1 to 22-8 has a capacity of 1 mega bits ($2^{20}$ bits) and data is inputted and outputted on 1 bit basis. Consequently, the main memory system has a 1M byte structure. An identical address is multiplexed and supplied to the respective DRAMs 22-1 to 22-8. Accordingly, an address of 10 bits is supplied to each DRAM.

In order to control access to the main memory, there are provided an address generator 17, a latch (TAG) 18, a comparator 19, a state machine 20 and an address multiplexer 21.

The address generator 17 generates an address of data required by the CPU, in response to address information from the CPU (not shown). If the main memory system is of the 1M byte structure, addresses of 20 bits (namely, a row address of 10 bits and a column address of 10 bits) are simultaneously transmitted onto a 20-bit address bus 40.

The latch (TAG) 18 receives the addresses from the generator 17 and stores the row address selected in the preceding cycle. The row address stored by the latch (TAG) 18 is not updated at the time of hit in the cache memory (hereinafter referred to as "cache hit"). It is updated by a row address newly generated by the address generator 17 at the time of miss in the cache memory (hereinafter referred to as "cache miss").

The comparator 19 compares the row address from the address generator 17 with the row address stored in the latch (TAG) 18 and generates a signal CH (cache hit) indicating the result of comparison. The signal CH is supplied to the latch (TAG) 18. Thus, updating of a content stored in the latch (TAG) 18 is controlled. The signal CH is also supplied to the state machine 20.

The state machine 20 generates control signals $\overline{RAS}$, $\overline{CAS}$ and $\overline{WE}$ in response to the signal CH and supplies those signals to the respective DRAMs 22-1 to 22-8. The signal $\overline{WE}$ is a signal for designating input and output of data to and from the main memory system. Data is read out at "H" level of the signal $\overline{WE}$ and data is written at "L" level thereof. The signal $\overline{WE}$ is supplied to the data input buffer and the data output buffer of each DRAM. Data is written in response to the later falling of the signals $\overline{CAS}$ and $\overline{WE}$. When the signal CH from the comparator 19 indicates a mismatch (a cache mishit), the state machine 20 temporarily raises the signals $\overline{RAS}$ and $\overline{CAS}$ to "H" level and then lowers those signals sequentially, whereby each DRAM executes normal operation cycle. At the same time, the state machine 20 supplies a signal WAIT to the CPU to bring the CPU into a wait state. When the signal CH indicates a match (a cache hit), the state machine 20 maintains the signal $\overline{RAS}$ at "L" level and toggles the signal $\overline{CAS}$, so that each DRAM performs page mode operation.

The address multiplexer 21 multiplexes the addresses from the address generator 17 and transmits the multiplexed addresses onto the 10-bit address bus 41 to supply the same to the respective DRAMs 22-1 to 22-8 under control of the state machine 20. When the signal CH indicates a mismatch, the address multiplexer 21 multiplexes the address of 20 bits supplied from the address generator 17 and generates a row address of 10 bits and a column address of 10 bits successively under control of the state machine 20. When the signal CH indicates a match, only a column address of 10 bits out of the addresses supplied is generated under control of the state machine 20.

Referring now to FIG. 6 indicating an operation waveform diagram, operation of the cache memory system shown in FIG. 5 will be described. The system clock shown in FIG. 6 is a clock for applying operation timing to the memory system and the CPU, and one machine cycle is defined by one clock.

According to procedures of a program, the CPU generates address information of necessary data. The address generator 17 generates, in response thereto, an address showing a location of storage of the data required by the CPU, at a rise of the system clock and supplies the address to the 20-bit address bus 40. The comparator 19 compares the 10-bit row address (RA2) out of the generated addresses with the row address (RA1) stored by the latch (TAG) 19. When those addresses match (RA1 = RA2), which means that the same row as that related with the memory cells accessed in the preceding cycle has been accessed, the comparator 19 generates the signal CH of "H" level, for example, indicating a cache hit. The state machine 20 toggles the signal $\overline{CAS}$ in response to the signal CH of "H" level from the comparator 19 with the signal $\overline{RAS}$ being maintained at "L" level (till then, the signal $\overline{RAS}$ is at "L" level and each DRAM is enabled). On the other hand, the address multiplexer 21 transmits the 10-bit column address to the 10-bit address bus 41 under control of the state machine 20 when the signal CH is generated. As a result, the respective DRAMs 22-1 to 22-8 perform page mode operation and provide data at high speed to the CPU in the access time $T_{CAC}$. (Input and output of the data are instructed by the signal $\overline{WE}$, whose instruction is given by the CPU and provided through the state machine 20.)

On the other hand, the row address (RA1) stored by the latch (TAG) 18 does not match with the row address (RA2) generated by the address generator 17, the comparator 19 does not generate the signal CH (or keeps the signal CH at "L" level). In this case, since the memory cells of a row different from that accessed in the preceding cycle are accessed, it is necessary to newly supply a row address to the respective DRAMs 22-1 to 22-8. When the signal CH is not generated, the state machine 20 brings the signals $\overline{RAS}$ and $\overline{CAS}$ temporarily into an inactive state at "H" level, so that the respective DRAMs 22-1 to 22-8 can execute the normal operation cycle. The address multiplexer 21 multiplexes the 20-bit address from the address generator 17 and transmits the row address and the column address successively by 10 bits to the address bus 41 under control of the state machine 20. The respective DRAMs 22-1 to 22-8 accept the row address at a fall of the signal $\overline{RAS}$ to select one word line and accepts the column address at a fall of the signal $\overline{CAS}$ to select one column, whereby information of the selected memory cell is outputted.

Thus, in the case of cache miss, the normal operation cycle beginning with $\overline{RAS}$ precharging is executed. The minimum value of the $\overline{RAS}$ precharge period is predetermined and the succeeding operation cycle can not be started before the elapse of the $\overline{RAS}$ precharge period. In addition, the access time until valid data is outputted is $T_{RAC}$ at low speed. Since this time $T_{RAC}$ is longer than one operation cycle time of the CPU, the state machine 20 supplies a signal WAIT to the CPU to bring it into a wait state. In the case of a cache miss, the latch (TAG) 18 stores a new row address on the address bus 40 and holds it. Control as to whether the stored content in the latch (TAG) 18 is to be changed or not is made by the signal CH.

In the above described construction, the latch (TAG) 18 stores a row address, and a match or a mismatch between the stored row address and a row address to be newly accessed is determined. In other words, in the conventional simple cache memory system, data for one row of a DRAM (1024 bits in the case of a 1M device) is formed as one block and a cache hit or a cache miss with respect to this data block is determined.

However, there is not a high probability that all the data of one block (1024 bits of one row for each DRAM in the above described prior art) are continuously accessed by the CPU. Therefore, the block size (namely, 1024 bits/DRAM) is unnecessarily large.

In addition, in the construction utilizing the page mode or the static column mode as in the above described prior art, the latch (TAG) 18 holds only one block (entry) and the capacity can not be further increased. Consequently, the cache hit rate can not be sufficiently increased. In other words, a cache hit occurs only in the case where the same row address is continuously accessed. Accordingly, if a program routine related with two consecutive row addresses is repeatedly executed, a cache miss always occurs and thus the function of the cache memory can not be satisfactorily performed.

A dynamic semiconductor memory device comprising a serial shift register having a number of stages equal to the number of columns in the memory cell array and connected to the columns through transfer gates is disclosed in U.S. Pat. No. 4,330,852 entitled "Semiconductor Read/Write Memory Array Having Serial Access", issued to D. J. Redwine et al, filed Nov. 23, 1973. In this device, data of cells of one row are transmitted in parallel between the shift register and an addressed row of memory cells. Data in the shift register are serially shifted from the register to external for a read operation. The device of the prior art comprises a data register which is serially accessed, and thus the device can not be employed as a cache memory which requires random access to the column on an addressed row.

The same device as discussed above is also described in a publication entitled "A High Speed Dual Port Memory with Simultaneous Serial and Random Mode Access for Video Application" by R. Pinkham et al, IEEE Journal of Solid-State Circuits Vol. A sc-19, No. 6, December 1984, pp. 999–1007.

A memory device with on-chip cache is disclosed by Matick et al. in U.S. Pat. No. 4,577,273 entitled "Distributed On-Chip Cache", filed Jan. 1, 1984. This prior art on-chip cache comprises a cell array and a master-slave register. The cell array is accessed through a first port, while the slave register is accessed through a second port. The master-slave register is employed as a cache. However, in this prior art, the master register receives data from the columns connected to an addressed row of the cell array. Therefore, this prior art also has disadvantages such as too large a data block size and too small entry number in the latch (TAG).

SUMMARY OF THE INVENTION

One object of the present invention is to provide a dynamic random access memory (DRAM) device containing a cache memory with an adequate data block size.

Another object of the present invention is to provide a DRAM device in which an increased number of entries can be stored in a tag in a simple cache system.

A further object of the present invention is to provide a simple cache system with an adequate data block size and an increased number of entries to be stored, thereby to improve the hit rate and cost performance of the system.

A still further object of the present invention is to provide a semiconductor memory device containing a cache memory with an improved cache hit rate and an adequate data block size without increasing the number of external pin terminals.

A still further object of the present invention is to provide an operating method for any of the above described device.

A DRAM device of the present invention includes a memory cell array divided into a plurality of cell blocks and a plurality of data storage blocks provided corresponding to the respective cell blocks. Each data storage block is operable to receive data on the columns in the corresponding cell block in response to an inactive row address strobe signal.

Each data storage block is also operable to output data therefrom corresponding to data on a selected column in response to an active row address strobe signal.

In the above described structure, the respective data storage blocks can store data of different rows on a basis of plural data bits, and thus the number of entries in a simple cache system is increased according to the number of the data storage blocks. In addition, the data block size of the simple cache system is reduced to an adequate size depending on the size of the data storage blocks of the main memories.

Furthermore, the row address strobe signal $\overline{RAS}$ is used as a signal for designating an access operation mode of the DRAM depending on a cache hit or a miss and accordingly operation of the DRAM can be controlled without any additional external terminals.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 2(a)-2(d) are typical waveform diagrams in a read operation in a normal mode of the Conventional DRAM.

FIGS. 3(a)-3(d) are typical waveform diagrams in a read operation in a page mode of the conventional DRAM.

FIGS. 4(a)-4(d) are typical waveform diagrams in a read operation in a static column mode of the conventional DRAM.

FIG. 11 is a schematic diagram showing a structure of a simple cache memory system according to another embodiment of the present invention.

DESCRIPTION OF THE PREFERRED EMBODIMENTS

An external control signal $\overline{RAS}$ (row address strobe) of a DRAM applies start timing for reading and writing of data in the normal operation mode. However, in the page mode cycle and the static column cycle which are fast access modes, timing for writing and reading of data is provided by a signal $\overline{CAS}$ or a signal $\overline{WE}$. Consequently, the signal $\overline{RAS}$ for providing a timing of start of a memory cycle and a row address strobe timing does not play any role in reading and writing of data in a fast access mode. For this reason, the signal $\overline{RAS}$ does not need to be maintained in the active state, i.e., at "L" level in the page mode cycle or the static column cycle.

Therefore, in the present invention, the signal $\overline{RAS}$ is defined as indicated below so as to be used as an operation control signal in a high-speed mode such as the page mode or the static column mode for the purposes of operating the DRAM in the fast access mode on occurrence of a hit in the cache memory (a cache hit) and operating, the DRAM in the normal mode on occurrence of miss in the cache memory (a cache miss).

Cache hit→signal $\overline{RAS}$ at "H"

Cache miss→signal $\overline{RAS}$ at "L"

Thus, the signal $\overline{RAS}$ commonly used in the DRAM is used as a signal for selecting operation mode of the DRAM dependent on a cache hit or miss and accordingly the operation of the DRAM can be controlled without increasing external terminals.

Figure 1:
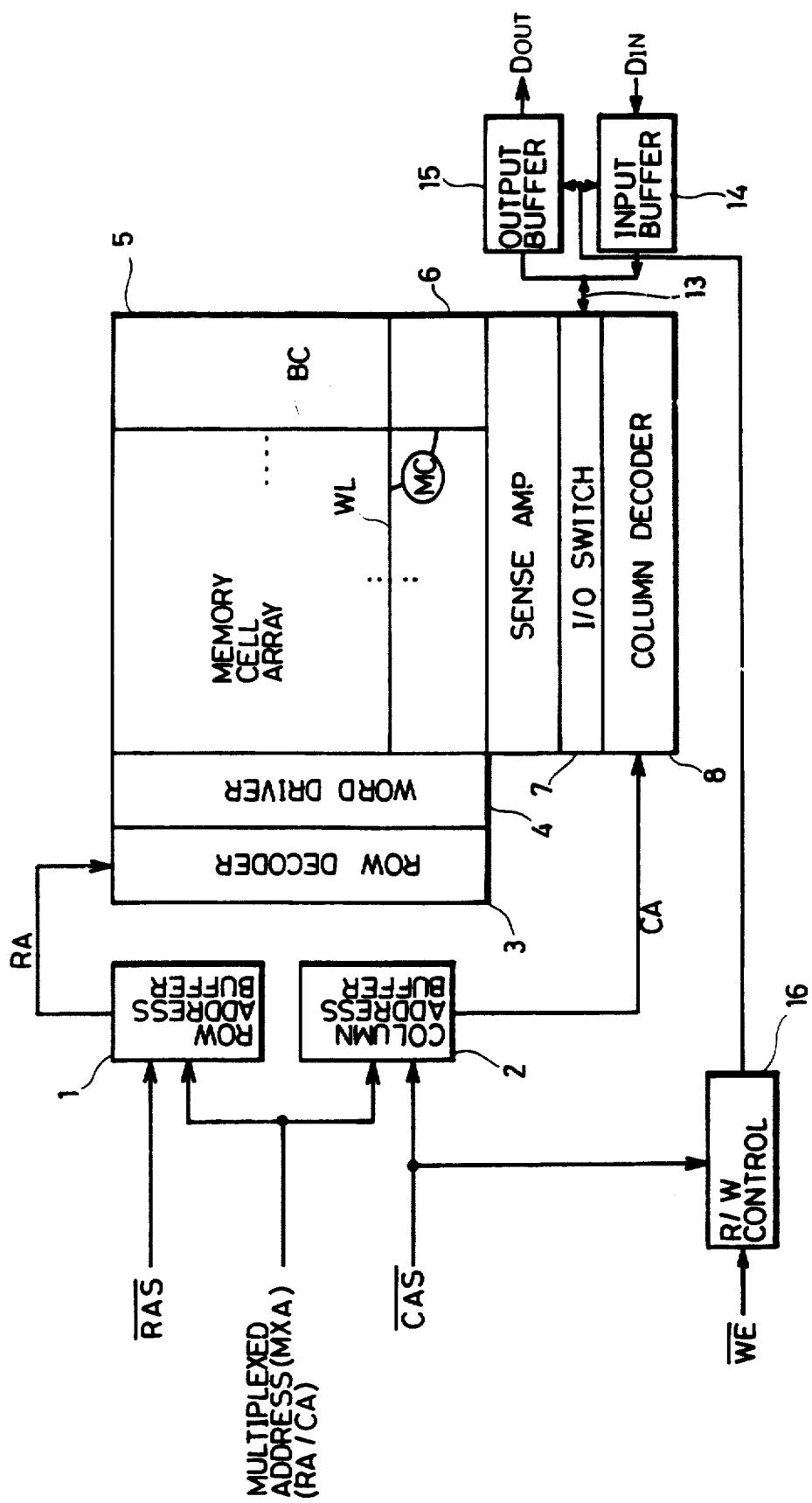
FIG. 1 is a schematic view showing an overall construction of a conventional DRAM.
Figure 5:
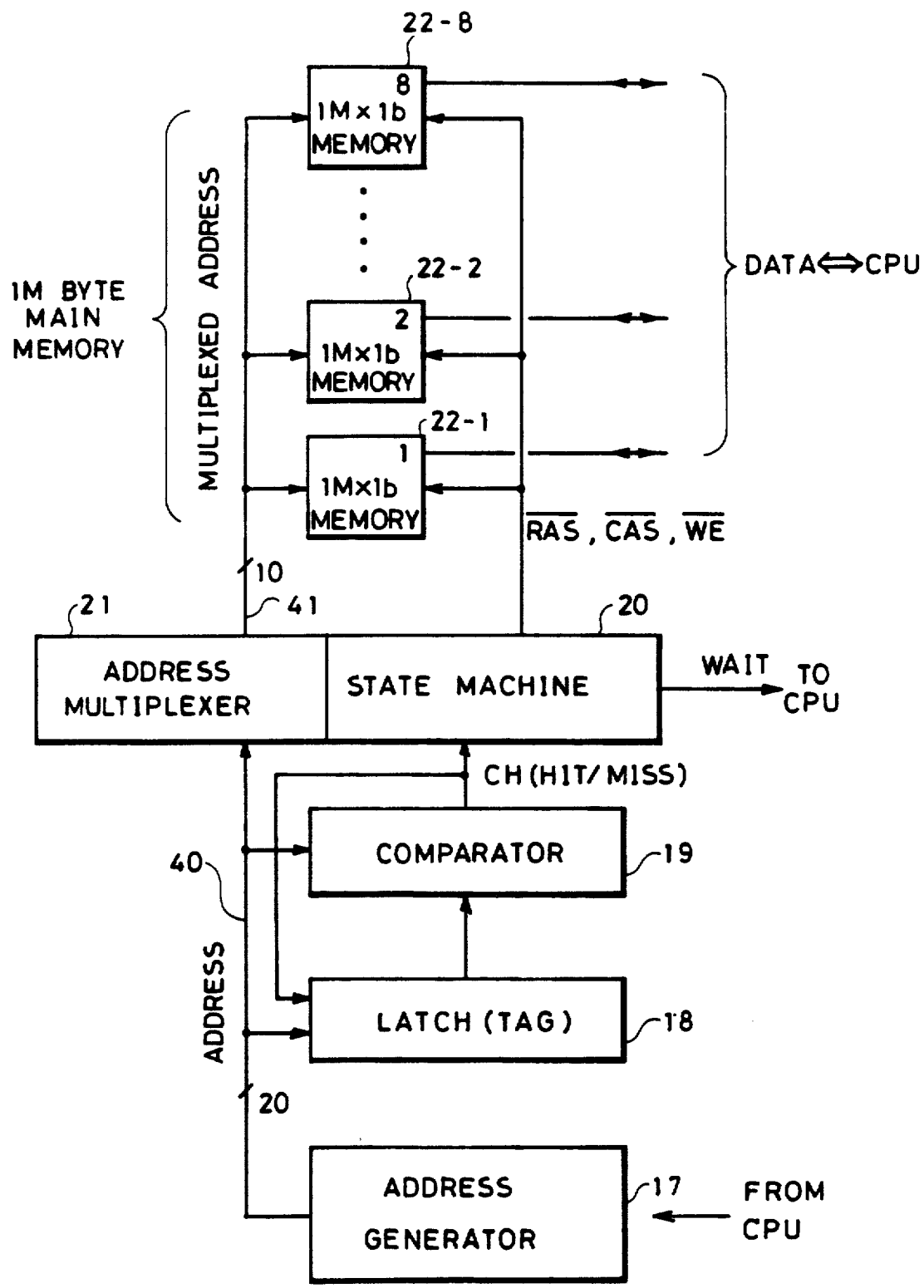
FIG. 5 represents a schematic structural diagram of a conventional simple cache system using DRAMs operable in a fast access mode.
Figure 6:
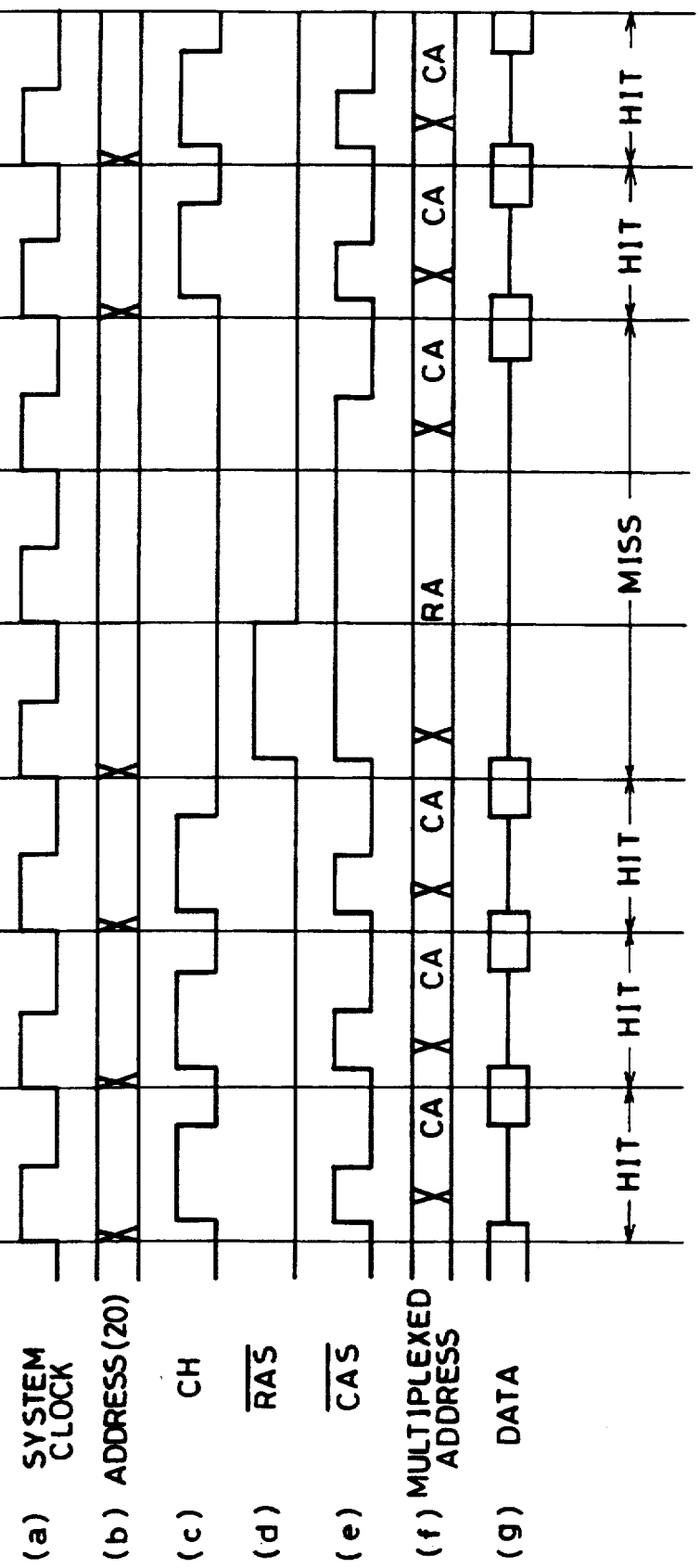
FIGS. 6(a)-6(g) are operation waveform diagrams for the simple cache system as shown in FIG. 5.
Figure 7:
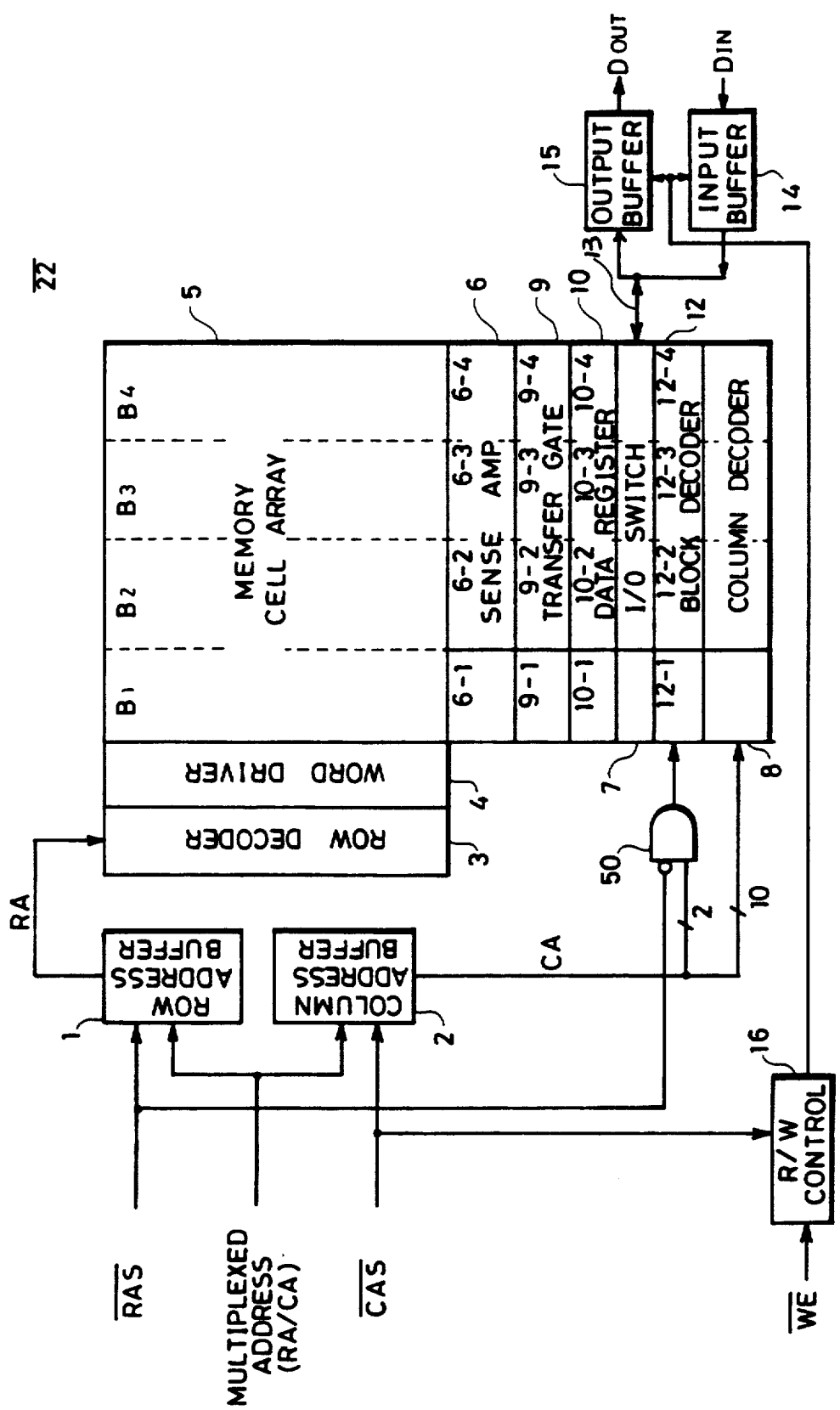
FIG. 7 represents a schematic structural diagram of a DRAM according to an embodiment of the present invention.

FIG. 7 schematically shows an entire structure of a semiconductor memory device containing a cache according to an embodiment of the present invention. In FIG. 7, the components corresponding to those of the memory device shown in FIG. 1 are denoted by the same reference numerals. The memory device (DRAM) 22 includes a memory cell array 5 divided into four blocks B1, B2, B3 and B4. In other words, one row (or a word line) in the memory cell array 5 is divided into four blocks B1 to B4. A block decoder 12 is provided to select one block out of the four blocks B1 to B4 of the memory cell array 5. There are provided, between the block decoder 12 and the memory cell array 5, a transfer gate 9 which turns on in response to a block selection signal from the block decoder 12 to transmit data of the columns in the selected block, and a data register 10 which latches the data transmitted through the transfer gate 9. An I/O switch (column selection switch) 7 which turns on in response to an output of a column decoder 8 is provided between the data register 10 and a data input/output bus 13.

An AND gate 50 which receives the row address strobe signal $\overline{RAS}$ at its false input and receives part of a column address CA (i.e., a block select address, which is an address of two bits if the number of blocks is 4) at its true input is provided to control operation mode of the block decoder 12. The AND gate 50 is enabled at "L" level of the signal $\overline{RAS}$ and disabled at "H" level of the signal $\overline{RAS}$. Accordingly, when the signal $\overline{RAS}$ is at "L" level, the block select address is transmitted to the block decoder 12. The block decoder 12 decodes the block select address from the AND gate 50 and generates a signal for selecting one of the blocks.

A transfer gate 9 operates on a block basis. More specifically, transfer gates connected to the selected block are conducted in response to the block select signal from the block decoder 12. A data register 10 is provided for each column in the memory cell array. The data register 10 latches data amplified and detected by a sense amplifier 6 through the conducted transfer gate. Consequently, when a cache miss occurs, the data of the block of the memory cell array 5 selected by the block decoder 12 is transferred through the turned-on transfer gate to be latched in the data register corresponding to the selected block, so that previous data are updated. When a cache hit occurs, the block decoder 12 does not operate and the transfer gate 9 is in the off state.

The column decoder 8 decodes the column address CA supplied thereto and selects one column in the memory cell array 5. The column select signal from the column decoder 8 is supplied to the I/O switch 7 so that the selected column is connected to the data input/output bus 13.

In the above described structure, the signal $\overline{RAS}$ is raised to "H" level at the time of a cache hit and accordingly the AND gate 50 is not enabled and therefore the block decoder 12 is not activated. Thus, since the transfer gate 9 is in the off state upon cache hit, data is read out from the data register 10 isolated from the memory cell array 5 in response to the column select signal.

On the other hand, when a cache miss occurs, the signal $\overline{RAS}$ is lowered to "L" level and the block decoder 12 is activated through the AND gate 50. Then, the block decoder 12 decodes the block select address and turns on the corresponding transfer gate. Thus, at the time of a cache miss the data latched by the sense amplifier connected to the columns selected by the column decoder 8 is read out. At the same time, the data of the data register provided corresponding to the selected block is updated by the data latched by the sense amplifier on the respective columns in the selected block.

Figure 8:
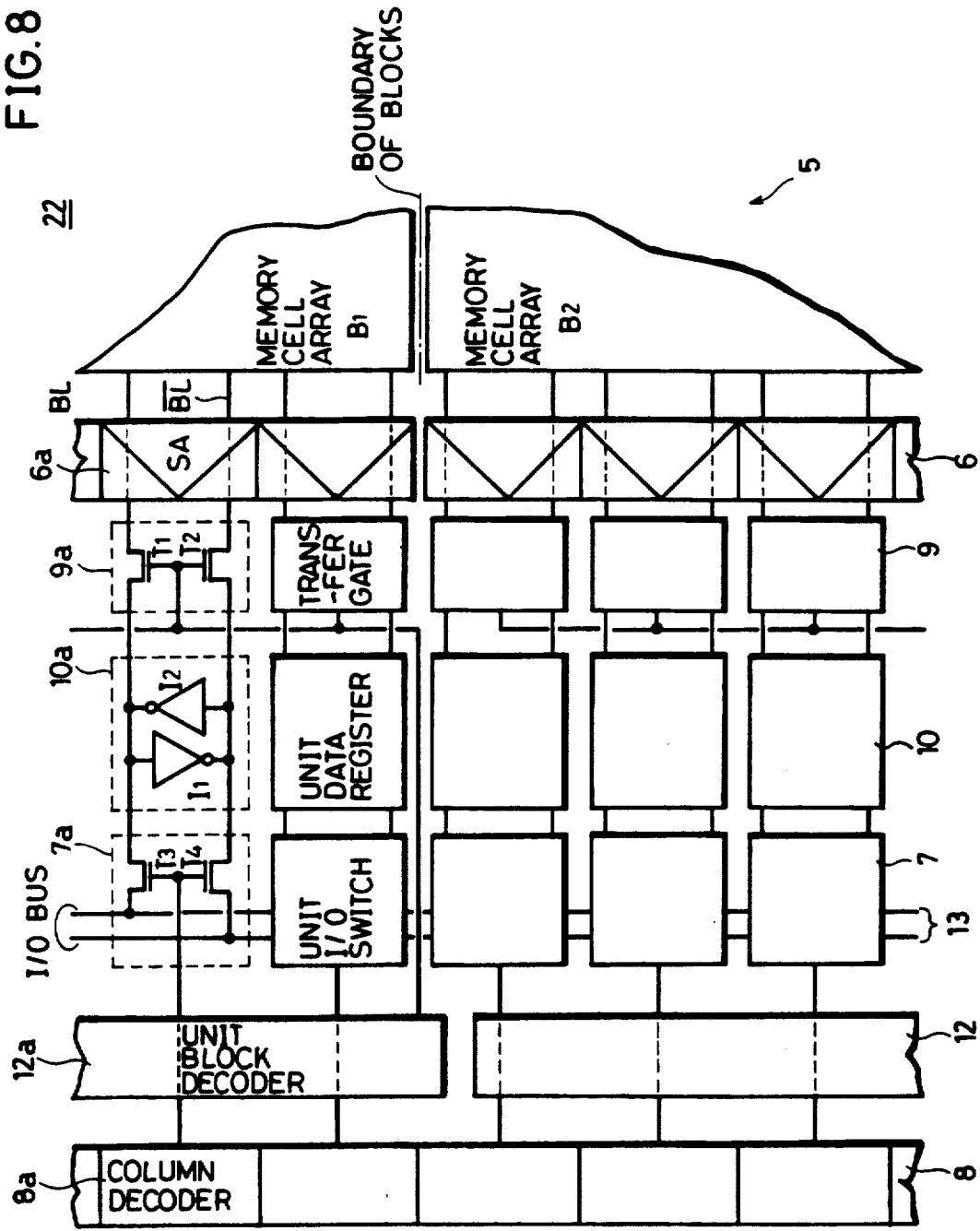
FIG. 8 represents a structure of the main part of the DRAM as shown in FIG. 7.

Referring to FIG. 8, main portions of the memory device according to the present invention are schematically shown.

In FIG. 8, components associated with part of the blocks B1 and B2 are exemplarily shown.

A column in the array 5 consists of a pair of bit lines BL and $\overline{BL}$ forming a folded bit line structure. Each pair of bit lines is provided with a unit sense amplifier 6a for amplifying and latching a differential signal voltage on the pair.

Each pair of bit lines is further provided with a unit transfer gate 9a, a unit data register (or a data latch) 10a and a unit I/O switch 7a.

The unit transfer gate 9a comprises two switching transistors T1 and T2 which turn on in response to a block select signal from a selected unit block decoder 12a.

The unit data register 10a comprises two inverters I1 and I2 which are connected in antiparallel between the bit lines BL and $\overline{BL}$ of the corresponding pair.

The unit I/O switch 7a comprises two switching transistors T3 and T4 which turn on in response to a column select signal from a selected unit column decoder 8a.

A block select signal from a unit block decoder 12a is transferred to the gates of the unit transfer gates 9a connected to the columns in the corresponding memory cell array block (B1 or B2 etc.).

In the structure of FIG. 8, when a cache hit occurs, each unit block decoder 12a is not activated and therefore the transfer gate 6 (or all of the unit transfer gates 9a) is kept in the off state to isolate the cell array 5 from the data register 10. A column address is applied to the column decoder 8 to select a unit column decoder 8a when the signal $\overline{CAS}$ goes low. Then, a unit I/O switch 7a connected to the selected unit column decoder 8a turns on to transfer the data stored in the unit register 10a connected thereto onto the data input/output bus 13.

When a cache miss occurs, the block decoder 12 is activated to select a block according to the received block select address (a part of the column address). Then, the unit transfer gates 9a connected to the columns in the selected block are turned on to connect the unit data registers 10a and the unit sense amplifiers 6a. Then, data latched by the unit sense amplifiers in the selected block are transferred in parallel to the unit data registers 10a. At the same time, one unit I/O switch 7a is turned on in response to the column select signal from the selected unit column decoder 8a. Thus, data of the selected memory cell is read out through the data input/output bus 13.

As described above, the data register 10 can store data of different tags (or rows) for different blocks.

Therefore, when the memory device according to the present invention is applied to a simple cache memory, the number of entries in the latch (TAG) can be increased without any complicated additional circuitry. Also the block size is reduced to an adequate size. Thus, a simple cache memory system is obtained with excellent cost performance and an improved cache hit rate.

Figure 9:
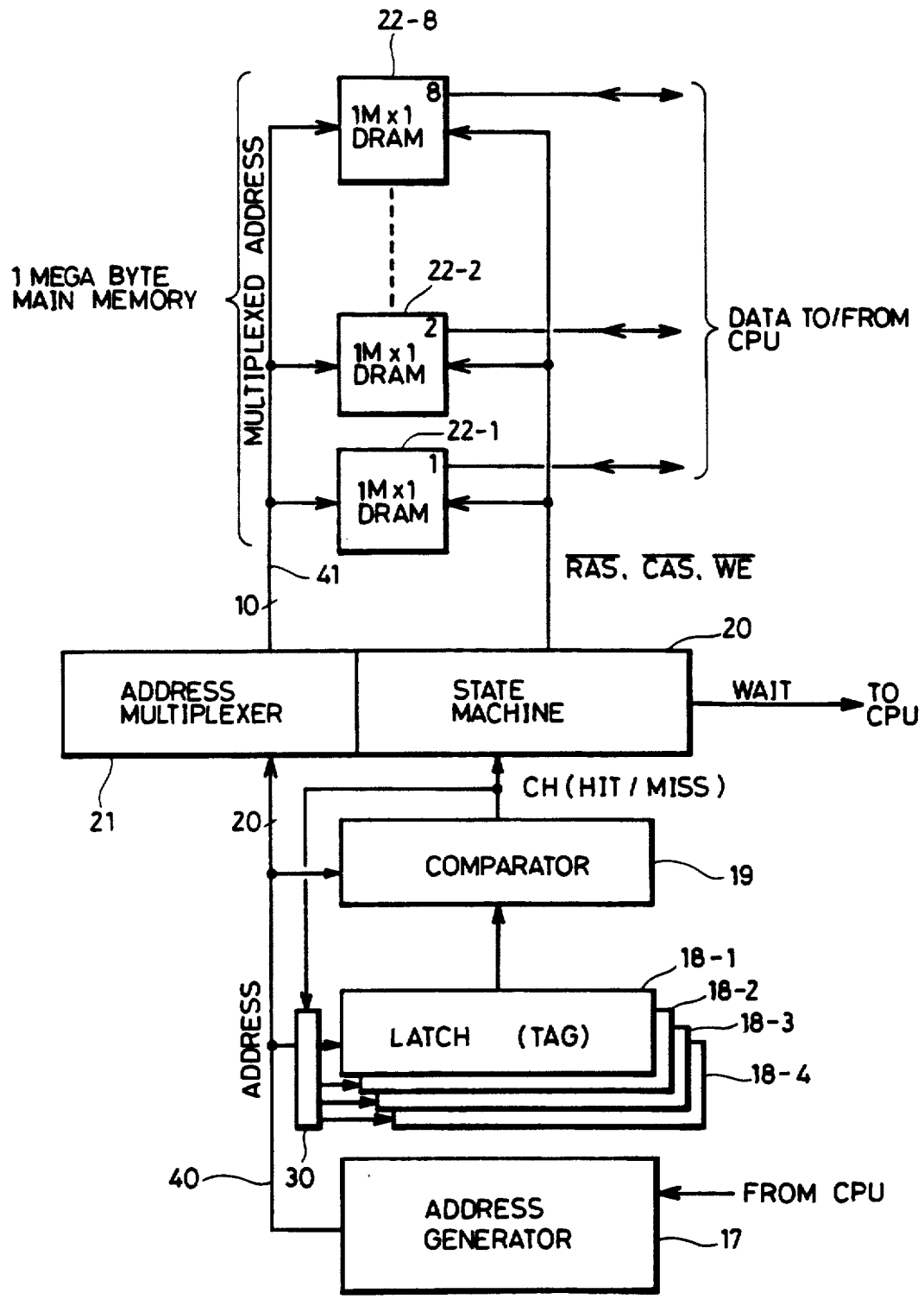
FIG. 9 is a schematic view showing a structure of a simple cache memory system utilizing DRAMs of the present invention.

FIG. 9 represents schematically a whole structure of the simple cache memory system according to the present invention. In the system, eight DRAMs each having 1M bits ×1 bit structure are employed to constitute a main memory of a capacity of 1 mega bytes (1M bits × 8 bits). Each DRAM has the same structure as shown in FIGS. 7 and 8.

The latch (TAG) 18 comprises four latches 18-1, 18-2, 18-3 and 18-4 provided corresponding to the memory cell array blocks B1 to B4. Each of the latches 18-1 to 18-4 holds a row address indicating a row addressed in the previous cycle in the memory cell array blocks B1 to B4.

The selector 30 receives all bits of the row address and two bits (for example, most significant two bits) of the column address from the address generator 17 and selects one latch according to the two bits of the column address.

The selector 30 does not transfer the row address when a cache miss signal CH is active, that is, a cache hit occurs. On the other hand, when a cache miss occurs, the selector 30 transfers the row address supplied thereto to the selected latch in response to the inactive cache hit signal CH, whereby the row address is held in the selected latch.

The comparator 19 compares the row address generated from the address generator 17 and the row address held in the latch selected by the selector 30 and outputs the cache miss signal CH indicating a result of comparison.

The address generator 17 issues a 20-bit address composed of a 10-bit row address and a 10-bit column address in response to address information from the CPU (not explicitly shown). The full 20-bit address is supplied to the address multiplexer 21. On the other hand, a 10-bit row address and part (two bits) of a 10-bit column address are supplied to the selector 30.

The state machine 20 controls operation of the address multiplexer 21 in response to the cache hit signal CH and outputs operation control signals $\overline{RAS}$, $\overline{CAS}$ and $\overline{WE}$ for the DRAMs. At this time, as is different from the prior art, the signal $\overline{RAS}$ is raised to "H" level in response to the active cache hit signal CH and lowered to "L" level in response to the inactive cache hit signal CH. More specifically, the signal $\overline{RAS}$ is supplied from the state machine 20 to the DRAMs 22-1 to 22-8, instead of the cache hit signal CH in the prior art.

Figure 10:
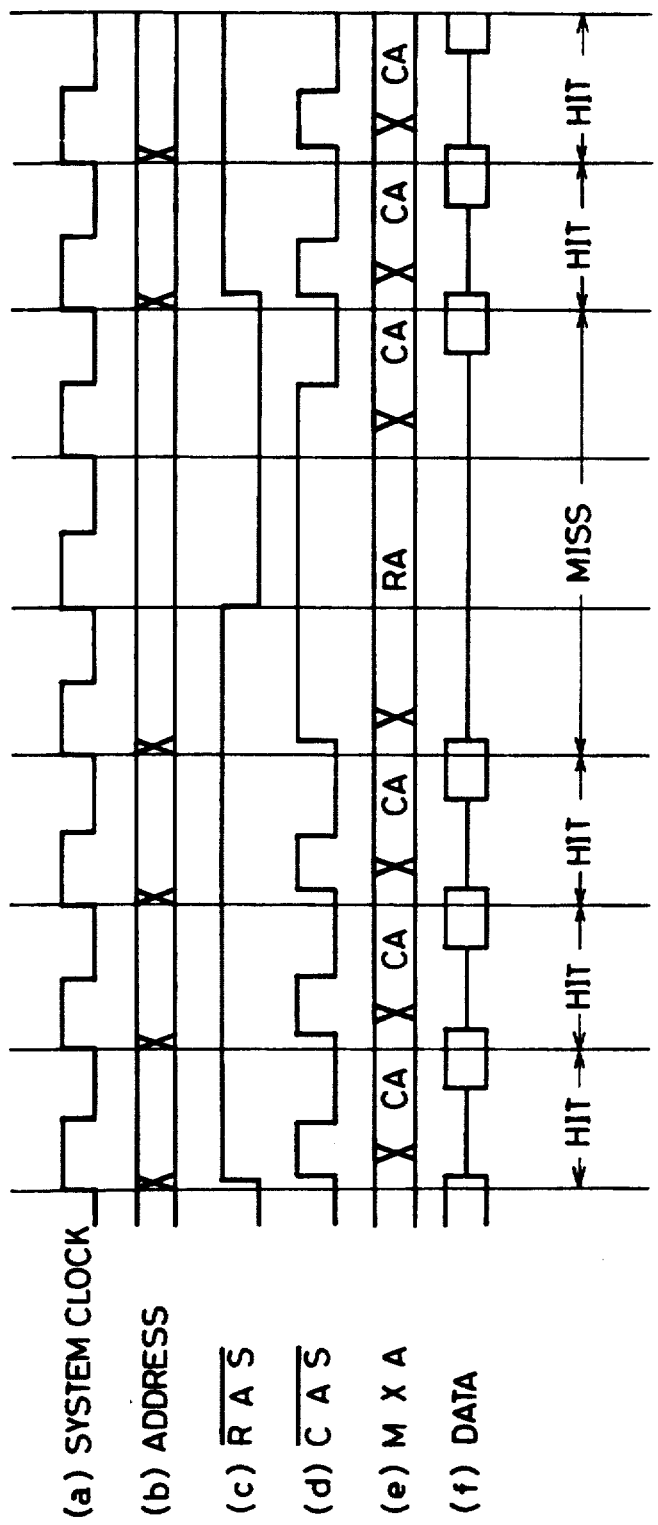
FIGS. 10(a)-10(f) are waveform diagrams showing operation of the simple cache memory system according to the above mentioned embodiment.

Referring to the operation waveform diagram of Fig. 10, operation of the simple cache memory according to the embodiment of the invention shown in FIGS. 7 to 9 will be described.

The row addresses RA1 to RA4 indicating rows accessed in the blocks B1 to B4 in the immediately preceding cycle are already latched in the latches 18-1 to 18-4, respectively, and data of the blocks B1 to B4 on that cycle are already latched in the data registers 10-1 to 10-4, respectively. For convenience of explanation, the sense amplifier, the transfer gate, the data register and the block decoder of each block are assigned additional reference numerals 10-1 to 10-4 so as to clarify correspondence relations between those components and the respective blocks B1 to B4.

In the above described condition, the address generator 17 generates address information indicating a location of data requested by the CPU (not shown) and supplies it to the 20-bit address bus 40. The selector 30 receives ten bits of the row address RA and two bits of the column address out of the 20-bit address. The selector 30 decodes the 2-bit column address and selects one of the latches 18-1 to 18-4 to render it effective. The selected latch corresponds to the selected block out of the blocks B1 to B4. It is assumed that the latch 18-2, that is, the block B2 is selected. The comparator 19 compares the row address from the latch 18-2 rendered effective and the row address from the address generator 17. If RA2 (the row address latched in the latch 18-2) is equal to RA (the row address from the address generator 17), it is determined that a cache hit occurs, and the active ("H" level) cache hit signal CH is supplied to the state machine 20 and also to the selector 30.

The state machine 20 supplies the signal $\overline{RAS}$ at "H" level to the DRAMs 22-1 to 22-8 in response to the active cache hit signal CH.

In the DRAMs 22-1 to 22-8, row selection is not effected because the signal $\overline{RAS}$ is at "H" level. In addition, the AND gate 50 is disabled because of "H" level of the signal $\overline{RAS}$, and therefore the block decoders 12-1 to 12-4 are all in the non-activated state. Accordingly the transfer gate 9 (or unit transfer gates 9a) are all in the off state. Consequently, the memory cell array 5 (or the sense amplifier 6) and the data register 10 are electrically isolated. In that situation, the data latched in the sense amplifier 6 are erased at the time of transition to "H" level of the signal $\overline{RAS}$, while the data in the data register 10 (or unit data registers 10a) are not erased and held therein.

The state machine 20 toggles the signal $\overline{CAS}$ holding the signal $\overline{RAS}$ at "H" level to apply it to the DRAMs. At the same time, the address multiplexer 21 applies, to the DRAMs, a 10-bit column address out of the received 20-bit address under control of the state machine 20.

In each of the DRAMs 22-1 to 22-8, the block decoder 12 can not receive the block select address by means of the AND gate 50 which in turn is disabled in response to the signal $\overline{RAS}$ at "H" level. Thus, the transfer gate 9 in each of the DRAMs 22-1 to 22-8 maintains the off state to isolate the data register 10 and the memory cell array 5. Then, the column decoder 8 decodes the received 10-bit column address to select one column, (or more precisely, one unit I/O switch). Thus, data in the unit data register connected to the selected unit I/O switch is transferred onto the data input/output bus 13 so as to be read out through the output buffer 15. As described above, output data can be obtained rapidly from the data register 10 in an access time $T_{CAC}$ as in the page mode.

On the other hand, when the comparator 19 can not detect coincidence between the newly received address tag (row address) and the contents of the latch (TAG) 18, that is, if RA≠RA2, it does not issue the cache hit signal CH, which indicates a cache miss. In response thereto, the state machine 20 determines that a cache miss occurs, and provides the signal $\overline{RAS}$ at "L" level.

In addition, the selector 30 transmits the 10-bit row address supplied from the address generator 17 to the selected latch 18-2 in response to the inactive ("L" level) cache hit signal CH indicating a cache miss, so that the content in the latch 18-2 is updated.

At this time, although the signal $\overline{RAS}$ is lowered to "L" level, the AND gate 50 is in a state waiting for the 2-bit column address since the column address is not yet supplied to the DRAMs 22-1 to 22-8. Accordingly, the block decoder 10 is not selected either and it is in the non-activated state, and thus, the transfer gates 9 are all in the off state.

Subsequently, the state machine 20 which has supplied the signal $\overline{RAS}$ at "L" level then lowers the signal $\overline{CAS}$ and controls the DRAMs 22-1 to 22-8 based on the signals $\overline{RAS}$ and $\overline{CAS}$ in the same manner as in the normal mode.

The address multiplexer 21 multiplexes the row address RA and the column address CA received and supplies the multiplexed address to the respective DRAMs 22-1 to 22-8 under control of the state machine 20. The DRAMs 22-1 to 22-8 accept the row address supplied thereto in response to a fall of the signal $\overline{RAS}$ and decode it to select one row. Data of the memory cells connected to the selected row are amplified and latched by the sense amplifier 6. On the other hand, the respective DRAMs 22-1 to 22-8 accept the multiplexed and supplied column address at a fall of the signal $\overline{CAS}$ and supply it to the column decoder 8 and, at the same time, the 2-bit column address for block selection is supplied to the AND gate 50. As a result, one of the block decoders 12-1 to 12-4 (for example, the block decoder 12-2) is selected in response to the block select signal from the enabled AND gate 50, whereby an activated block select signal is outputted. Thus, the transfer gate 9-2 connected to the selected block decoder 12-2 is turned on and data in the selected block B2 are transferred to the selected data register 10-2. Concurrently with this transfer operation, the column decoder 8 decodes the 10-bit column address and turns on a unit I/O switch 7a connected to a column designated by the 10-bit column address. As a result, information of the selected memory cell is transmitted onto the I/O bus 13 and read out through the output buffer 15.

As described above, when a cache miss occurs, output data $D_{OUT}$ is obtained from the DRAMs 22-1 to 22-8 in a slow access time $T_{RAC}$. Consequently, the state machine 20 generates a signal WAIT and supplies it to the CPU (not shown) to cause the CPU to be in a wait state. Further, a new row address is held in the latch 18-2 selected by the selector 30. Consequently, the content of the data register 10-2 and that in the latch 18-2 corresponding to the selected block are updated by new data, while the contents of the remaining data registers and latches are not updated.

It is to be noted that the AND gate 50 performs the function of controlling activation of the block decoder 12 based on the signal $\overline{RAS}$. More specifically, the gate 50 is enabled in response to the signal $\overline{RAS}$ at "L" level to activate a block decoder corresponding to the 2-bit column address. Accordingly, it should be considered that the AND gate 50 is enabled and disabled under control of the signal $\overline{RAS}$ to perform the function of decoding the address for block selection. Therefore, the AND gate 50 may be replaced by a buffer to be enabled in response to "L" level of the signal $\overline{RAS}$ to supply the 2-bit column address to the block decoder 12. In the above described situation, the column address CA is supplied with a delay after the transition of the signal $\overline{RAS}$ to "L" level and accordingly operation timing of the gate 50 or the buffer and the block decoder is delayed from the transition of the signal $\overline{RAS}$ to "L" level. Particularly, when a cache miss occurs, it is preferred to turn on the transfer gate 9 after amplification and latching of data by the sense amplifier 6 and thus the timing of activation of the block decoder or the timing of generation of a block selection (activation) signal from the block decoder is preferably deferred by a predetermined period after the transition of the signal $\overline{RAS}$ to "L" level.

In the above described embodiment, data reading operation was described. Operation for writing data is performed with the same timing as that for reading of data except that the signal $\overline{WE}$ is raised to "H" level and that the direction of transmission of data is opposite to that in the case of reading.

Thus, the DRAMs 21-1 to 21-8 in the cases of a cache hit and a cache, miss are controlled on the basis of the respective blocks B1 to B4 and those blocks B1 to B4 are independently capable of storing data groups for different row addresses in the respective data registers 10-1 to 10-4. Accordingly, the number of entries is four. As a result, the device of the invention is applicable even to cases in which a program routine related with two consecutive row addresses is repeatedly executed, and thus the cache hit rate is improved.

In addition, since the signal $\overline{RAS}$ which, in general, is always connected to DRAMs is used for determination of a cache hit and a cache, miss, it is not needed to additionally provide particular terminals for another external control signal and thus the number of external pin terminals is not increased.

In the embodiment shown in FIG. 7, the cache memory is controlled according to the signal $\overline{RAS}$ irrespective of whether reading or writing is selected. In the alternative, the control can be also effected in the following manner. As shown in FIG. 11, an OR gate 60 receives as input signals the signal $\overline{RAS}$ and the signal obtained by inversion of the write signal $\overline{WE}$, and the AND gate 50 receives a signal obtained by inversion of an output of the OR gate 60 as an enable control signal. Thus, in write operation ($\overline{WE}$ = "L"), all the block decoders 12 are inactivated, that is, every transfer gate 9 is not conducted irrespective of whether the signal $\overline{RAS}$ is at "H" level or at "L" level.

Consequently, in an operation mode called a copy back mode, necessary data (data to be copied in the cache memory) can be written in the data register 10 in response to the signals $\overline{RAS}$ and $\overline{CAS}$.

Although the memory cell array is divided into four blocks in the above described embodiment, the number of the blocks is not limited thereto, and any other number of the blocks can be employed.

Furthermore, although eight DRAMs each having the structure of 1 Mb×1 bit are employed to constitute the 1M byte main memory, any other number of DRAMs with other structure may be used for the main memory.

As described above, according to the present invention, the memory cell array is divided into a plurality of blocks and each block has a data register for containing data of the columns in the block. Thus, information of different rows can be held in the data registers and if those data registers are used for a cache memory system, an adequate data block size and an increased number of entries can be obtained. Accordingly, the simple cache memory system thus provided has an enhanced cache hit rate and improved cost performance.

In addition, the contents of the data registers can be updated at high speed since column information in a selected block is simultaneously transferred to the corresponding data register to that block at the time of a cache miss.

When a cache hit occurs, data are read out by accessing the data registers and accordingly the reading can be carried out without degrading the high speed of the fast access mode of the DRAMs.

Furthermore, switching between the access to the data registers and the access to the memory cell array is effected in response to the signal $\overline{RAS}$. Accordingly, it is not necessary to provide a new external control signal for the control or to add a new external terminal. Thus, the number of pin terminals of a DRAM is not increased and the DRAM is compatible to a DRAM in a conventional simple cache memory.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device in a cache system, comprising:
   a memory cell array comprising a plurality of memory cells arranged in a matrix of rows and columns and divided into a plurality of blocks of columns;
   a plurality of blocks of storage means, each storage means corresponding to a respective column of said memory cell array, for storing data from the columns of corresponding memory cell blocks;
   first means for accessing said storage means in response to an address signal;
   second means for accessing said memory cells in response to row and column addresses; and
   third means receiving a row address strobe signal as a cache hit/miss signal indicating match or nonmatch of an applied address with an address corresponding to data stored in said storage means for enabling said second means when the row address strobe signal indicates a cache miss.

2. A semiconductor memory device in accordance with claim 1, wherein said second means includes means for coupling said memory cell array with said storage means for bidirectional information transfer in response to said now address strobe signal and predetermined bits of said externally applied column address.

3. A semiconductor memory device in accordance with claim 1, wherein said second means includes means for isolating said memory cell array from said storage means, in response to said cache hit signal.

4. A semiconductor memory device in accordance with claim 1, wherein said third means includes block selector means for selecting one of said memory cell blocks to couple the selected memory cell block to the corresponding storage means, thereby to transfer data between the selected memory cell block and the corresponding storage means.

5. A semiconductor memory device in accordance with claim 1, wherein each said storage means comprises data latches provided in one-to-one correspondence for the columns in said memory cell array, and said first and second means are in common provided with column selector means for selecting at least one column corresponding to an externally applied column address.

6. A semiconductor memory device in accordance with claim 4, wherein said third means includes fourth means in responsive to said now address strobe signal to be enabled for transferring received predetermined bits of an externally applied column address to said block selector means.

7. A semiconductor memory device in accordance with claim 6, wherein said fourth means include means responsive to said cache hit signal for disabling said block selector means.

8. A semiconductor memory device in accordance with claim 1, wherein said fourth means further comprises gate for carrying out a logical operation.

9. A semiconductor memory device in accordance with claim 8 wherein said gate comprises an OR gate having inputs receiving said row address strobe signal and an inverted write enable signal.

10. A method for operating a cache memory system including at least one randomly accessible memory device comprising a memory cell array having a plurality of memory cells arranged in a matrix of rows and columns and divided into a plurality of memory cell blocks, a plurality of sense amplifiers corresponding to the columns of said memory cell array for detecting and amplifying and latching data on said columns and a plurality of data latch means corresponding to the columns in said memory cell array and provided separately from said sense amplifiers each for receiving data on a corresponding column to latch the received data, said cache memory system further including means for generating a cache hit/miss indicating signal indicating whether at least one of data stored in said data latches is requested to be accessed, said method including the steps of:
  applying to said memory device a row address strobe signal for providing a row address strobe timing in response to said cache hit/miss indicating signal;
  isolating said plurality of data latch means from said plurality of sense amplifiers in response to said row address strobe signal indicative of a cache hit;
  selecting one of said memory cell blocks in response to said row address strobe signal indicating a cache miss to transfer the data latched by said sense amplifiers included in the selected block, thereby to replace the contents of the data latches with the transferred data, based on a block select address included in an externally applied column address;
  accessing data stored in at least one of the data latch means provided for said selected block in response to said externally applied column address when said row address strobe signal indicating the cache hit is received; and
  accessing data latched by at least one of said sense amplifiers in response to said column address when said row address strobe signal indicating the cache miss is received.

11. A semiconductor memory device for use in a cache system, said memory device comprising:
  a memory cell array comprising a plurality of memory cells arranged in a matrix of rows and columns and divided into a plurality of blocks of columns;
  a plurality of storage means provided for a respective memory cell block for storing data on the columns of the corresponding one of the memory cell blocks;
  first means for accessing said storage means in response to an externally applied column address;
  second means for accessing said memory cell array in response to externally applied row and column addresses; and
  third means for enabling either said first means or said second means in response to a level of a row address strobe timing signal;
  said system including
  generator means for generating a cache hit/miss indicating signal indicating match of the externally applied row addresses and any one of the most recently addressed row in each block; and
  control means for setting said row address strobe timing signal at a high level in response to an indication of said match by said cache hit/miss signal and for setting said row address strobe timing signal at a low level in response to a non indication of said match by said cache hit/miss signal.

12. A semiconductor cache memory system comprising:
  a memory cell array comprising a plurality of memory cells arranged in a matrix of rows and columns, said memory cell array divided into a plurality of memory cell blocks each corresponding to a grouping of columns of said matrix;
  cache storage means provided for each of said memory cell blocks for storing data of the corresponding memory cell block;
  latch means corresponding to each said memory cell block for storing row address information corresponding to the row of said memory cell block addressed,
  first generator means for generating a cache hit indicating signal when a externally applied address matches address information in the said latch means;
  second generator means for generating a row address strobe signal in the absence of said cache hit indicating signal;
  first means for accessing data, corresponding to an externally applied column address, from said cache storage means;
  second means for accessing said memory cell array corresponding to externally applied row and column addresses; and
  third means for enabling said second means in response to a memory cell array activating control signal,
  wherein said control signal is responsive to said row address strobe signal for providing a row address strobe timing to said memory device.

13. A semiconductor memory device for use in a cache memory system, comprising:
  a memory cell array including a plurality of memory cells arranged in a matrix of rows and columns;
  a cache memory comprising a plurality of storage means for storing data from said memory cells;
  first means for accessing said storage means in response to an address signal;
  second means for accessing said memory cells in response to row and column addresses; and
  third means receiving a row address strobe signal as a cache hit/miss signal indicating match or nonmatch of an applied address with an address corresponding to data stored in said cache memory for enabling said second means when the row address strobe signal indicates a cache miss.

14. A semiconductor memory device in accordance with claim 13, wherein said second means includes means for coupling said memory cell array cells with said storage means for bidirectional data transfer in response to said row address strobe signal and predetermined bits of an externally applied column address.

15. A semiconductor memory device in accordance with claim 13, wherein said second means includes means for isolating said memory cell array from said storage means in response to a cache hit.

16. A semiconductor memory device in accordance with claim 13, wherein said storage means comprises data latches provided in one-to-one correspondence with the columns in said memory cell array, and said first and second means are in common provided with column selector means for selecting at least one column corresponding to an externally applied column address.

* * * * *